US006807645B2

(12) United States Patent
Angelotti et al.

(10) Patent No.: US 6,807,645 B2
(45) Date of Patent: Oct. 19, 2004

(54) METHOD AND APPARATUS FOR IMPLEMENTING ENHANCED LBIST DIAGNOSTICS OF INTERMITTENT FAILURES

(75) Inventors: Frank William Angelotti, Rochester, MN (US); Steven Michael Douskey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 446 days.

(21) Appl. No.: 10/066,825

(22) Filed: Feb. 4, 2002

(65) Prior Publication Data

US 2003/0149925 A1 Aug. 7, 2003

(51) Int. Cl.[7] ............................................. G01R 31/28
(52) U.S. Cl. ....................... 714/732; 714/729; 714/733
(58) Field of Search ................................ 714/729, 732, 714/733, 724, 726

(56) References Cited

U.S. PATENT DOCUMENTS

| | | | | |
|---|---|---|---|---|
| 5,844,917 A | * | 12/1998 | Salem et al. ................. | 714/724 |
| 5,983,380 A | * | 11/1999 | Motika et al. ............... | 714/733 |
| 6,442,723 B1 | * | 8/2002 | Koprowski et al. ......... | 714/732 |
| 6,587,981 B1 | * | 7/2003 | Muradali et al. ........... | 714/726 |
| 6,728,914 B2 | * | 4/2004 | McCauley et al. .......... | 714/726 |

* cited by examiner

*Primary Examiner*—Joseph D. Torres
(74) *Attorney, Agent, or Firm*—Joan Pennington

(57) ABSTRACT

A method and apparatus are provided for enhanced Logic Built in Self Test (LBIST) diagnostics. First multiplexers are respectively coupled between adjacent sequential channels of a plurality of sequential channels under test. Each of the first multiplexers selectively receives a first data input in a first scan mode with the sequential channels configured in a common scan path and a second data input in a second scan mode with each the sequential channels configured in a separate scan path responsive to a first control signal. A first multiple input signature register (MISR) including multiple MISR inputs is coupled to a respective one of the plurality of sequential channels under test. A blocker function is configured for blocking all MISR inputs except for a single MISR input receiving the test data output of the last sequential channel responsive to a recirculate control signal. A second MISR shadow register is coupled to the first multiple input signature register.

32 Claims, 15 Drawing Sheets

US 6,807,645 B2

METHOD AND APPARATUS FOR IMPLEMENTING ENHANCED LBIST DIAGNOSTICS OF INTERMITTENT FAILURES

FIELD OF THE INVENTION

The present invention relates generally to the data processing field, and more particularly, relates to a method and apparatus for implementing enhanced Logic Built in Self Test (LBIST) diagnostics of intermittent failures.

DESCRIPTION OF THE RELATED ART

During manufacture of integrated circuits, manufacturers rely on sophisticated testers to test the chips via external pins. Test stimulus are applied via external pins to the inputs and the outputs are observed. Typical manufacturing defects include shorts, opens, stuck-at-1, stuck-at-0, and the like. As integrated circuit technology improves, more and more logic can be packed into a single package or chip. Single chip microprocessors, as an example, include millions of transistors including multiple memory arrays and logic. A limited number of pins exist on a chip package and the number of pins a tester can handle is limited. Typically some hardware for testing is provided on the IC chip. On-chip testing hardware is used to test the chip, such as, a built-in self-test (BIST) hardware.

Logic built-in self-test (LBIST) in the industry is primarily used for detecting stuck at faults. In this case, isolation to the single failing latch is fairly straight forward. The simplest method being a binary search to locate the first failing cycle, during which a failing result indicates that the failing test is earlier in the sequences, while a passing result says it is later. Once the first failing cycle is located the scan rings are dumped and compared against known good results.

Known designs not only incorporate at speed testing into LBIST, but commonly use this function in conjunction with clock skewing to track hardware performance and potentially sort chips. As a result, occurrence of intermittent failures becomes more common. Analysis of these intermittent failures is more problematic. During the same binary search, a failing result continues to indicate that the failure is earlier in the test, while a passing result may indicate the failure is later, or simply that it did not occur this time. It is not usually possible to be sure which cycle is actually failing, until extra effort is taken in analyzing all scan channel latches.

A need exists for an improved mechanism for implementing diagnostics of intermittent failures.

SUMMARY OF THE INVENTION

A principal object of the present invention is to provide a method and apparatus for implementing enhanced Logic Built in Self Test (LBIST) diagnostics of intermittent failures. Other important objects of the present invention are to provide such method and apparatus for enhanced Logic Built in Self Test (LBIST) diagnostics of intermittent failures substantially without negative effect and that overcome many of the disadvantages of prior art arrangements.

In brief, a method and apparatus are provided for enhanced Logic Built in Self Test (LBIST) diagnostics of intermittent failures. A respective one of a plurality of first multiplexers is coupled between adjacent sequential channels of a plurality of sequential channels under test. Each of the first multiplexers selectively receives a first data input in a first scan mode with the sequential channels configured in a common scan path and a second data input in a second scan mode with each the sequential channels configured in a separate scan path responsive to a first control signal. A second multiplexer, coupled between a test data output of a last sequential channel and the first data input of a first sequential channel; selectively receives the test data output of the last sequential channel and an external test data input responsive to a recirculate control signal. A first multiple input signature register (MISR) including multiple MISR inputs is coupled to a respective one of the plurality of sequential channels under test. A blocker function is coupled between the first multiple input signature register and the plurality of sequential channels under test. The blocker function is configured for blocking all MISR inputs except for a single MISR input receiving the test data output of the last sequential channel responsive to the recirculate control signal. A second MISR shadow register is coupled to the first multiple input signature register.

In accordance with features of the invention, the examination of at least two successive LBIST cycles is enabled so that intermittently failing test cycles can be easily located. The second MISR shadow register stores MISR data for comparison with MISR data from the first multiple input signature register. A plurality of secondary MISR shadow registers with an associated cycle count register can be used for storing MISR data for comparison with MISR data from the first multiple input signature register with a matching cycle count.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
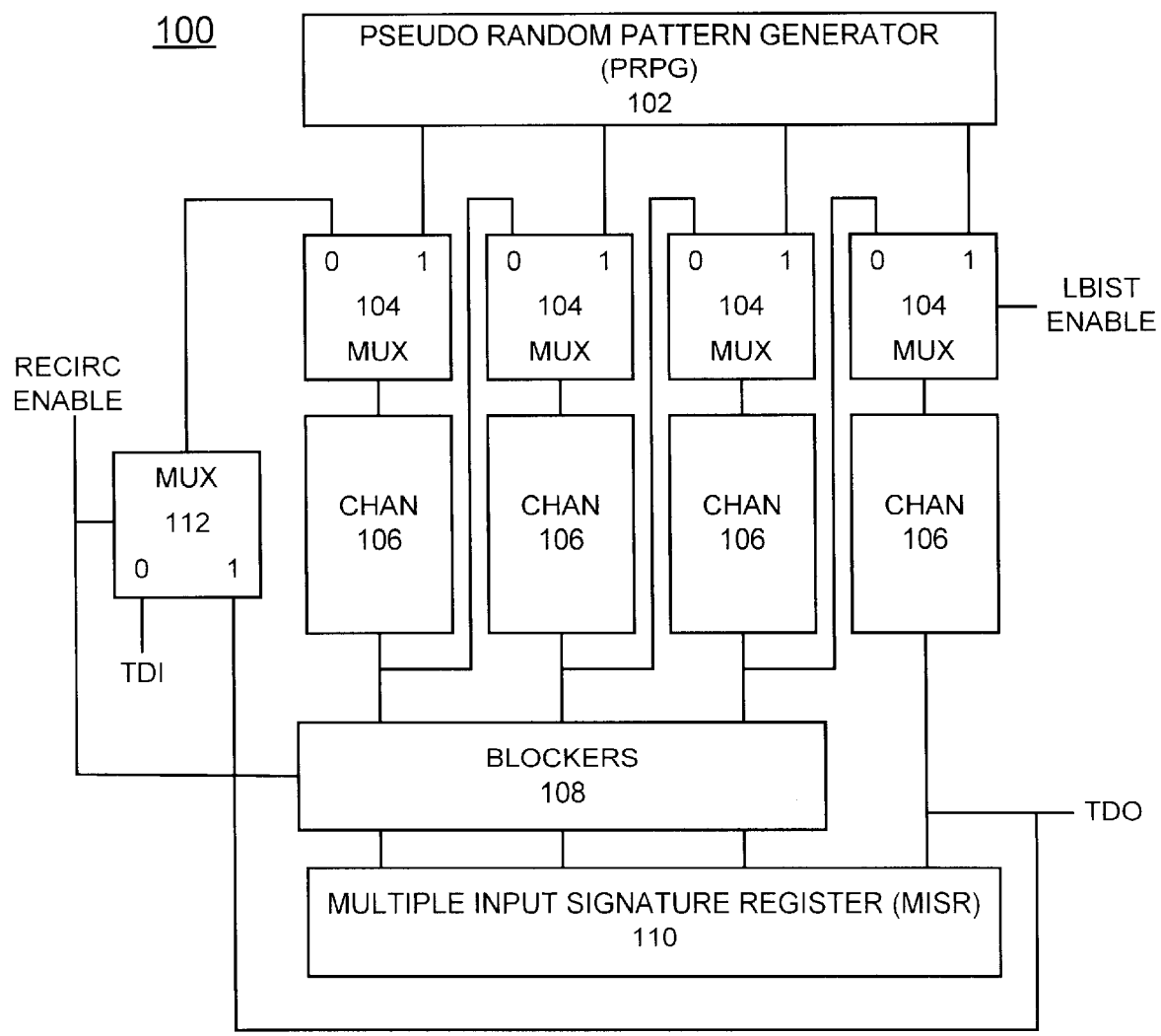
FIG. 1A is a schematic block diagram representation of apparatus for implementing enhanced Logic Built in Self Test (LBIST) diagnostics in accordance with the preferred embodiment.

Having reference now to the drawings, in FIG. 1A there is shown apparatus for implementing enhanced Logic Built in Self Test (LBIST) diagnostics in accordance with the preferred embodiment generally designated by the reference character 100.

In accordance with features of the preferred embodiments, saving or automatically comparing compressed LBIST results for multiple LBIST test cycles are enabled. Generating a special compressed result or signature for a single LBIST test cycle while simultaneously restoring all the compressed data to its original state is enabled. If the single LBIST signature matches a known good signature for the test cycle, then the LBIST sequence can continue to the next cycle of interest. If the single LBIST signature mismatches the known good signature for the test cycle, the compressed data has not been lost and can be fetched for detailed analysis.

LBIST diagnostics apparatus 100 provides an improvement of the standard LBIST architecture. LBIST diagnostics apparatus 100 includes a pseudo random pattern generator (PRPG) 102 coupled by a plurality of first multiplexers (MUXs) 104 to a respective one of multiple channels 106 under test. The channels 106 include multiple memory elements or shift registers of circuits under test. In first scan mode, all the memory elements in the logic under test are configured by the first multiplexers (MUXs) 104 in a common scan path of all shift registers of the channels 106, as shown in FIG. 1A. In a second scan mode, each of the channels 106 is configured in a separate scan path by the first multiplexers 104. A LBIST enable input labeled LBIST ENABLE is applied to the control input of the MUXs 104 for enabling the first and second scan modes. A blockers logic circuit or blockers function 108 is coupled between the multiple channels 106 under test and a first or primary multiple input signature register (MISR) 110. Blockers function 108 enables blocking all inputs to the MISR 110 or setting MISR inputs to logic zero, except for a single MISR input receiving a test data output (TDO) of the channels 106 connected together into a single scan path. A second multiplexer (MUX) 112 receiving an external test data input (TDI) applied to a first input and the test data output (TDO) applied to a second input has an output coupled to a first input of a first one of the MUXs 104. A respective output of adjacent sequential channels 106 is applied to a first input of a next one of the MUXs 104 in the first scan mode. Test pattern data from the PRPG 102 is applied via MUXs 104 to the channels 106 in the second scan mode. A recirculating enable input labeled RECIRC ENABLE is applied to the control input of MUX 112 and to the blockers function 108 for selecting the TDO data input as the input to the channels 106 with the single TDO applied to the MISR 110.

In accordance with features of the preferred embodiment, an enhanced mode operation of LBIST diagnostics apparatus 100 enables the test result data for a single cycle to be compressed in the MISR 110 while simultaneously recirculating back into all the memory elements of the channels 106. First a general LBIST cycle is paused after running a launch/capture clock sequence. Next the MISR value is read out and the MISR is optionally set to zero. The chip is then configured in enhanced scan mode where all memory elements in the logic under test are connected as a single long shift register. The shift out side of the scan register TDO is applied to an input of the MISR 110 and back to the scan in side of the long shift register formed by channels 106 via MUX 112. All other inputs to the MISR 110 are blocked or set to logic 0 by the blockers function 108. Then the long scan register formed by channels 106 and the MISR 110 are shifted for exactly the number of bits in the long register. Now the test result data from the current LBIST cycle is compressed in the MISR 110 and recirculated back to the exact position in the channel memory elements where it was at the start. The MISR value is read out and the MISR is reloaded from the earlier MISR value read and saved before the MISR was set to zero. The MISR value read out result from the MISR is compared against data from simulation or a known good chip to quickly determine if the current LBIST cycle has passed or failed; failing data still exists in the channels 106 so that diagnostic isolation can be performed. Now LBIST continues with the next scan/compress stage.

Figure 1B:
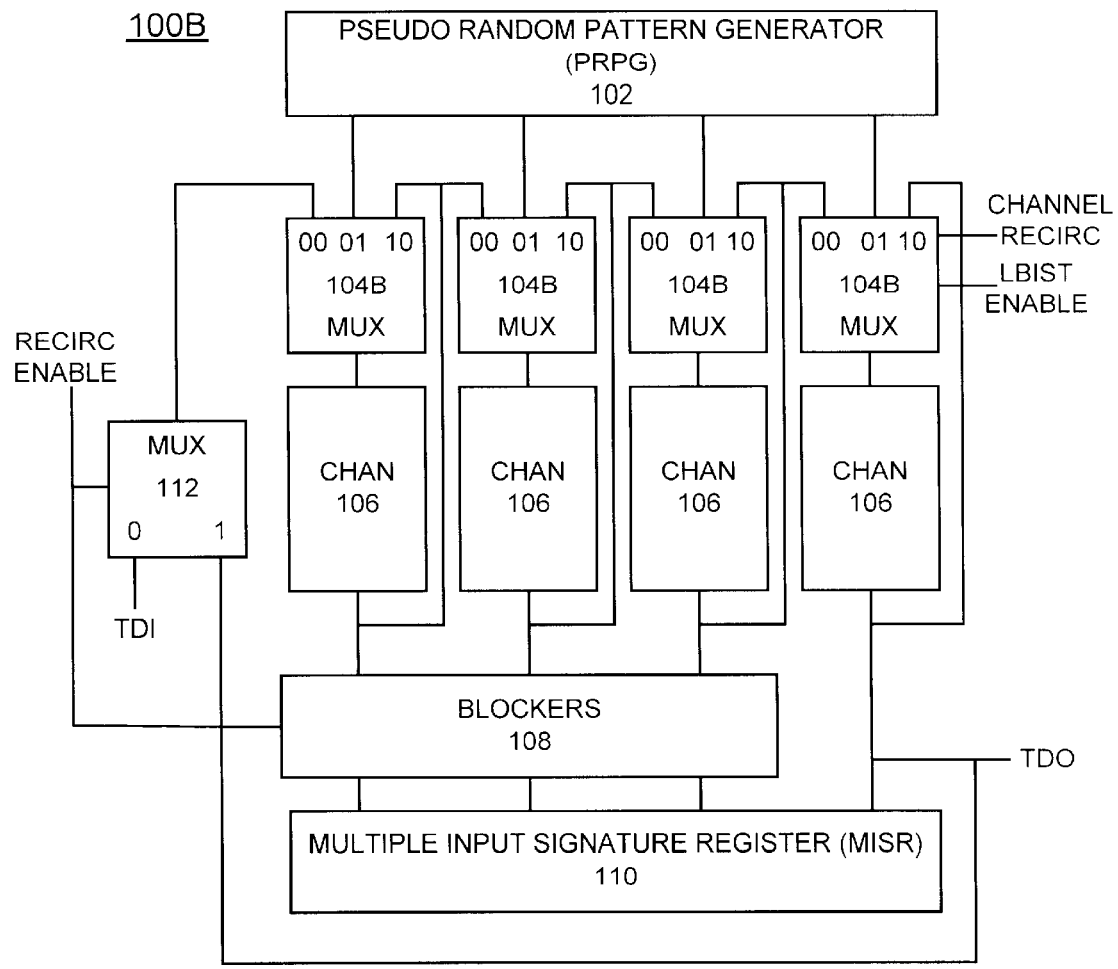
FIG. 1B is a schematic block diagram representation of alternative apparatus for implementing enhanced Logic Built in Self Test (LBIST) diagnostics in accordance with the preferred embodiment.

Referring now to FIG. 1B there is shown apparatus for implementing enhanced Logic Built in Self Test (LBIST) diagnostics in accordance with the preferred embodiment generally designated by the reference character 100B. The same reference numbers are used for similar or identical components of apparatus 100B in FIG. 1B as used in apparatus 100 of FIG. 1A. LBIST diagnostics apparatus 100B of FIG. 1B can be used to implement a compress while restore step with lower costs. The additional capabilities of the LBIST diagnostics apparatus 100B of FIG. 1B are only useable if all the test channels 106 have identical length. LBIST diagnostics apparatus 100 of FIG. 1A is used to compress and restore the single cycle data in the general case.

LBIST diagnostics apparatus 100B includes a pseudo random pattern generator (PRPG) 102 coupled by a plurality of first multiplexers (MUXs) 104B to a respective one of multiple channels 106 under test. The channels 106 have an identical length L including the same number of memory elements. Each of the channels 106 includes multiple memory elements or shift registers of circuits under test with identical length obtained, for example, by added memory elements that are used only for test for each channel shorter than the set length L. MUXs 104B include a third channel input coupled to a respective channel output. In first scan mode, all the memory elements in the logic under test are configured by the first multiplexers 104B in a common scan path of all shift registers of the channels 106, as shown in FIG. 1B. In a second scan mode, each of the channels 106 is configured in a separate scan path by the first multiplexers 104B for LBIST scan/compress. In a third channel recirculated scan mode, each channel output is multiplexed back to its respective input. A channel recirculating input labeled CHANNEL RECIRC is applied to the control input of MUX 112. A LBIST enable input labeled LBIST ENABLE is applied to the control input of the MUXs 104 for enabling the first and second scan modes. A function table for the CHANNEL RECIRC and LBIST ENABLE control signal is provided in the following Table 1.

TABLE 1

| CHANNEL RECIRC | LBIST ENABLE | FUNCTION |
| --- | --- | --- |
| 0 | 0 | Global Recirculate or Load |
| 0 | 1 | LBIST scan/compress |
| 1 | 0 | channel recirculated |
| 1 | 1 | Init to 0 |

Multiplexers have N binary control inputs and connect 1 of $2^N$ binary control inputs to the output. MUXs 104B is a four input multiplexer, so the extra input is used for an initialization to zero function.

When all the scan channels 106 are the same length L, as shown in FIG. 1B, the compression in the MISR 110 can be run for L clock cycles with each channel output multiplexed back to its respective input. After the compression step, failing data will still exist in the correct location in channels 106.

Figure 2:
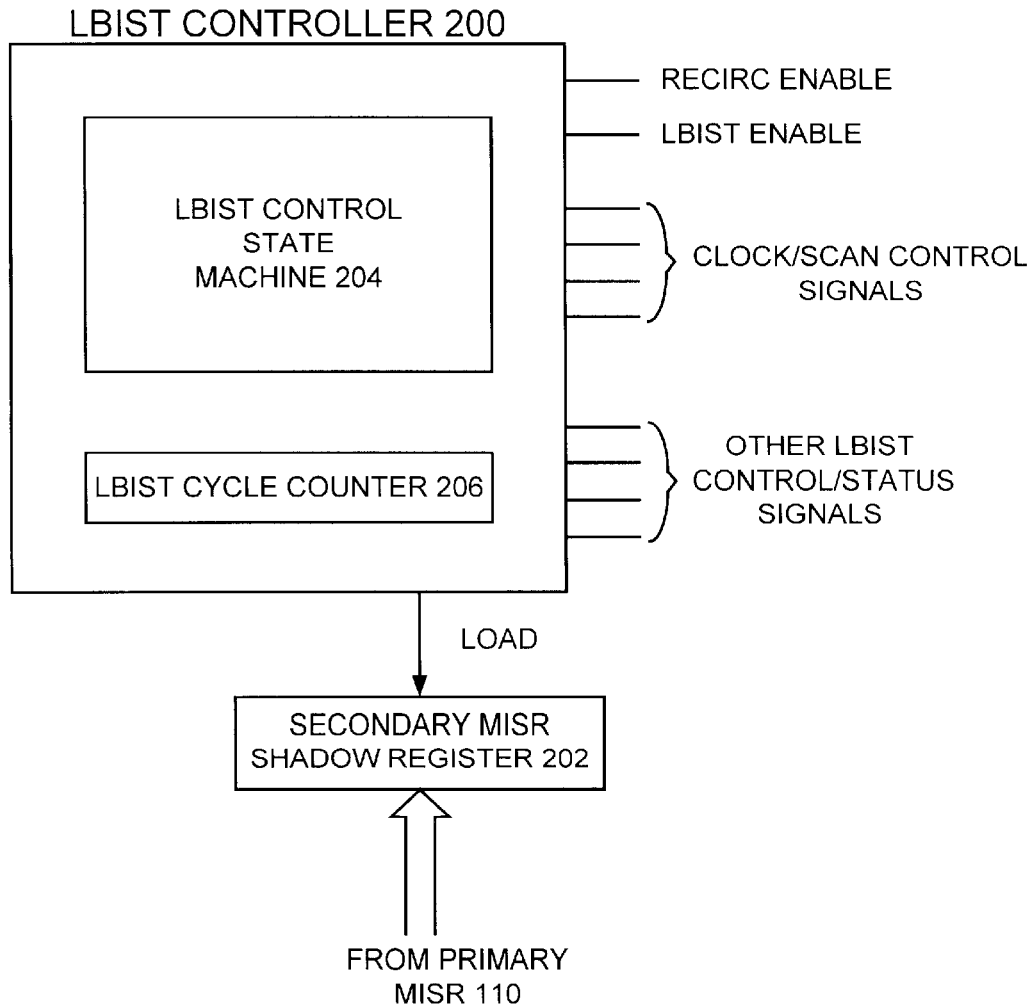
FIG. 2 is a schematic block diagram representation of an LBIST controller and a secondary MISR shadow register used with the apparatus of FIG. 1A or FIG. 1B for implementing enhanced Logic Built in Self Test (LBIST) diagnostics in accordance with the preferred embodiment.

Referring to FIG. 2, there is shown an LBIST controller 200 and a secondary MISR shadow register 202 used with the apparatus 100 of FIG. 1A or the apparatus 100 of FIG. 1B for implementing enhanced Logic Built in Self Test (LBIST) diagnostics in accordance with the preferred embodiment. Secondary MISR shadow register 202 is coupled to the primary multiple input signature register (MISR) 110 of FIG. 1A or 1B. LBIST controller 200 includes an LBIST control state machine 204 and an LBIST cycle counter 206. LBIST controller 200 is coupled to the LBIST diagnostics apparatus 100 for sending and receiving control and status signals including RECIRC ENABLE, LBIST ENABLE, clock/scan control signals and other LBIST control and status signals. LBIST controller 200 is connected to the secondary MISR shadow register 202 providing control as indicated at line labeled LOAD.

Figure 3:
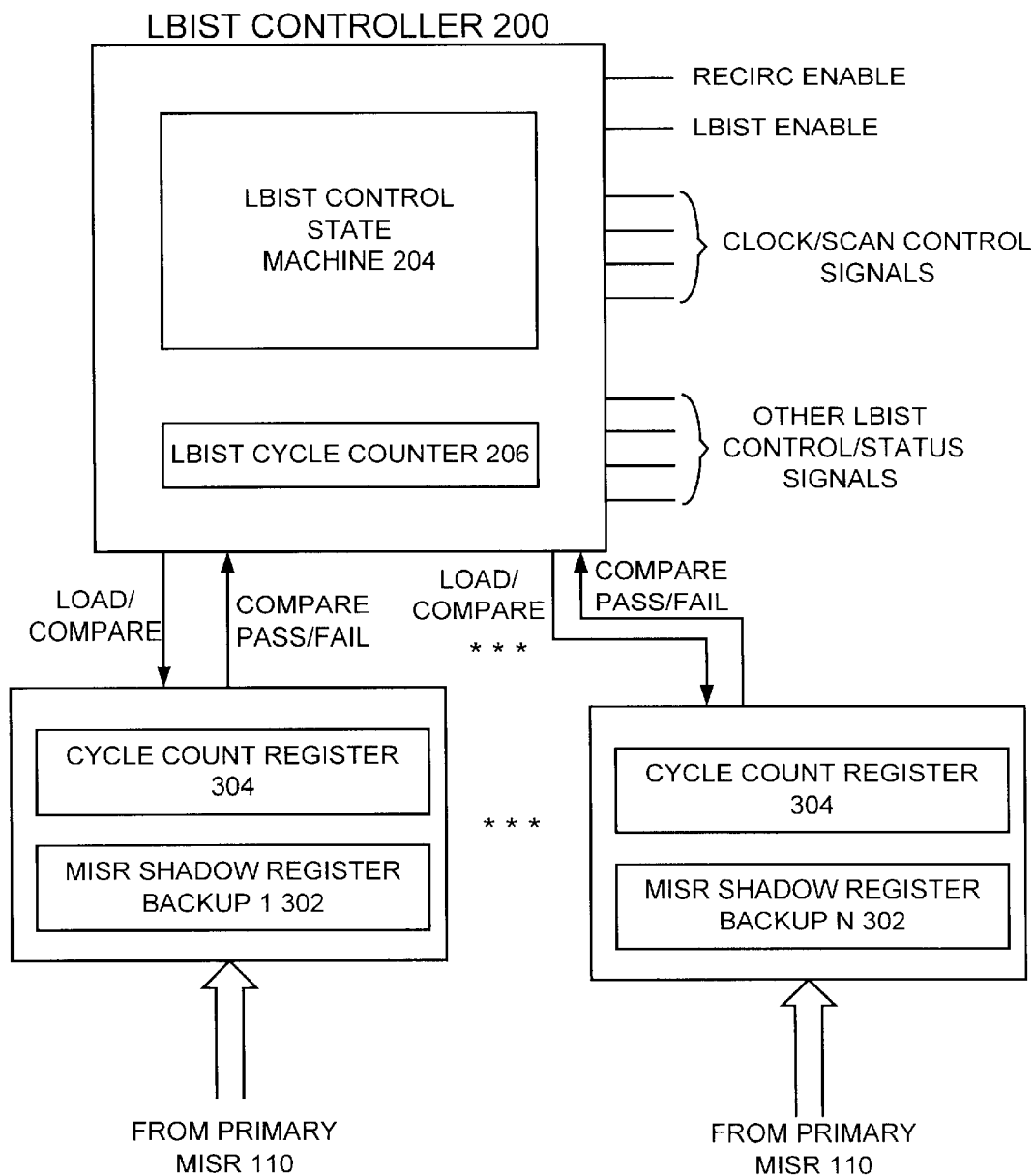
FIG. 3 is a schematic block diagram representation of an LBIST controller and a plurality of secondary MISR shadow registers and cycle counter registers used with the apparatus of FIG. 1A or FIG. 1B for implementing enhanced Logic Built in Self Test (LBIST) diagnostics in accordance with the preferred embodiment.

Referring to FIG. 3, there is shown LBIST controller 200 and a plurality of secondary MISR shadow registers 302 used with the apparatus 100 of FIG. 1A or the apparatus 100 of FIG. 1B for implementing enhanced Logic Built in Self Test (LBIST) diagnostics in accordance with the preferred embodiment. Each of the plurality of secondary MISR shadow registers 302 is coupled to the primary MISR 110 of apparatus 100 of FIG. 1A or 1B. An associated cycle counter register 304 respectively is provided with each of the multiple secondary MISR shadow registers 302. LBIST controller 200 is connected to the secondary MISR shadow registers 302 providing control signals as indicated at line labeled LOAD/COMPARE and receiving status signals as indicated at line labeled COMPARE PASS/FAIL.

In accordance with the features of the preferred embodiments, various hardware configurations are enabled that all allow looking at the results of at least two successive LBIST cycles. In this manner an intermittently failing test cycle can be more easily located. The ideal result would be a passing cycle immediately followed by a failing cycle. Note that while this absolutely identifies a failing cycle, it may not be the first failing cycle.

In accordance with the features of the preferred embodiments, a most general case allows MISR sampling at programmable steps throughout the test. This is simply accomplished by implementing a number of secondary MISR shadow registers 302, each with a matching register preloaded with counter values, as shown in FIG. 3. As LBIST runs and counts down its tester cycles, the preloaded counter values are compared to the cycle count, and the MISR value is saved when they match. When the test completes, LBIST controller 200 or software compares each MISR with known good results and adjusts the search accordingly. Eventually the preloaded counter values will represent successive cycles, and typically a pass/fail combination results. It should be noted that a fail/fail combination does allow stepping the failing cycle counter down one value. So the top value of the binary search can confidently be decremented downwardly.

In accordance with the features of the preferred embodiments, an alternative approach is to preload the correct MISR results at each counter value and provide a hardware compare. While this requires some additional logic, however, this arrangement enables stopping the test when a failure is detected.

In accordance with the features of the preferred embodiments, another option with similar advantages, but much less hardware, is to use the scan latches or channels 106 to store one of two signatures utilizing LBIST diagnostics apparatus 100. A test is stopped after running the system clocks, but before compressing the data in the MISR 110. The MISR contains the results from N−1 cycles, while the results from the final test are still in the rings or channels 106. LBIST controller 200 reads the N−1 signature, then sends a command to compress the channel data for the final signature. The final result is then read for comparison. This requires minimal additional hardware and this method has been implemented.

Once the failing cycle is detected, the test is rerun and stopped just short of compressing the final data in the MISR. The scan channels are then dumped and compared with known good data, often collected from a working chip, or an earlier test when this chip under test has passed. This usually involves tens or hundreds of thousands of bits of data. With intermittent failures it is often likely that all this data is correct. If instead the data has been loaded into the MISR, a passing signature would have been seen. Compressing this data in the existing MISR while it is being scanned out results in a signature that can be used to quickly identify when the test actually identified a failing cycle.

A more convenient method is to feed the MISR 110 with just the end of the scan path and load it while the data is being retrieved, as illustrated in FIG. 1. The resulting scan signature in the MISR 110 can be compared with the same value generated from a good chip, for example, stored in the secondary MISR shadow register 202. Thus immediately determining if the cycle failed.

Combining the above concepts allows a hardware driven test that repeats until it isolates a failure. An intermittently failing cycle is selected, with the known good scan signature loaded in a parallel MISR, such as secondary MISR shadow register 202 of FIG. 2. The test is then run, stopping just short of scan compressing the data in the MISR 110. The data is then scanned and recirculated within the channels 106 under test. This results in the scan signature being collected, while the data is still stored in the scan channels 106. If the signatures match, no failure was found and the test is automatically rerun. If the signatures mismatch, the failure has been captured, the testing stops and flags the capture. This could result in raising an attention to software, or setting a bit that software periodically checks while the test is running. If the test is run from the beginning default PRPG, MISR and TestLength values are used; otherwise, shadows of each of these registers need to be added along with some sequence changes.

The above-described methods use typical binary search techniques. For intermittent problems, another style binary search to locate a hot spot can be more productive and can still be enhanced by the above. For this, the test is actually divided into independent parts and preloading the PRPGs, MISRs, and channels with a different start point is required. Each independent test section is run multiple times and scored. The test section that fails most often is further divided and each subsection again scored. Successively taking the section that fails the most will yield a hot spot in the failing design. This hot spot can then be repeated with the above concepts. It should be noted though that this method runs smaller and smaller test sections that may not stress the chip as much as when part of the total test. So once the hot spot is determined, it can be beneficial to run the entire test to this point, especially for characterization.

It should be understood that an alternate solution to finding the failing cycle may be to single step LBIST. This would allow software to compare every cycle rather than binary search. However, this does not allow the test to run under the same noise, temperature and power conditions as under normal operating conditions.

Figure 4:
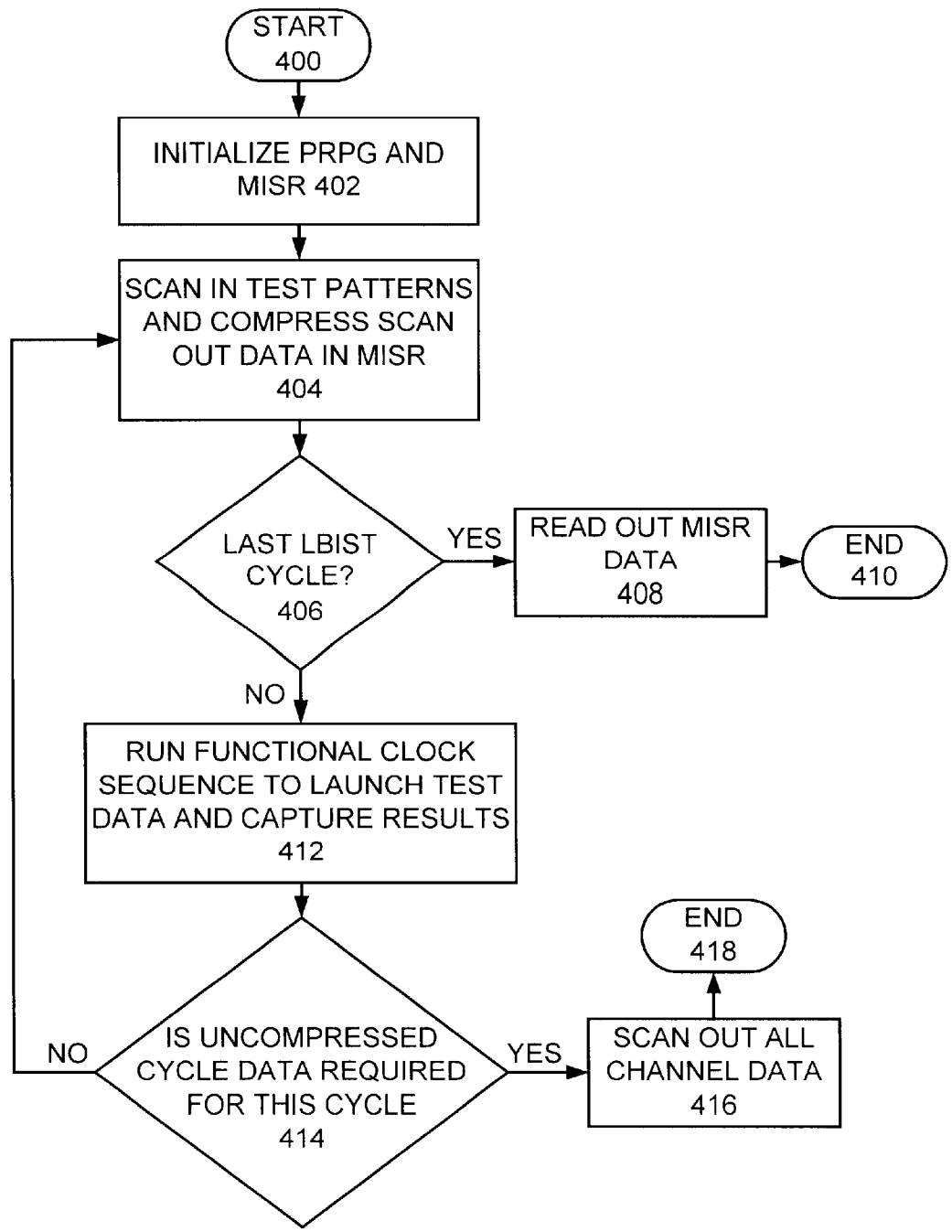
FIG. 4 is a flow chart illustrating a general LBIST cycle flow in accordance with the preferred embodiment.

Referring to FIG. 4, there are shown exemplary steps of a general LBIST cycle flow in accordance with the preferred embodiment starting at a block 400. The PRPG 102 and the MISR 110 are initialized as indicated in a block 402. Test patterns are scanned into channels 106 from PRPG 102 and scan out data are compressed into the MISR 110 as indicated in a block 404. Checking for a last LBIST cycle is performed as indicated in a decision block 406. When the last LBIST cycle is identified, then the MISR data is read out as indicated in a block 408. Then the sequential operations end as indicated in a block 410. When the last LBIST cycle is not identified, then a functional mode is set and a functional clock sequence is run to launch the scanned in test data through combinational logic and to capture the results in the memory elements of channels 106 as indicated in a block 412.

Checking whether uncompressed cycle data is required for this cycle is performed as indicated in a decision block 414. When uncompressed cycle data is not required for this cycle, then the sequence is repeated returning to block 404. The sequential steps are repeated many times to expose the channels 106 or logic under test to a large amount of test pattern data. Each iteration of these steps is called an LBIST cycle. When uncompressed cycle data is required for this cycle, then all channel data is scanned out as indicated in a block 416. Then the sequential operations end as indicated in a block 418. The LBIST process runs for a particular number of cycles that are tracked by the LBIST cycle counter 206. For example, consider an LBIST sequence of N cycles. Any subset of these N cycles can be run simply by loading the PRPG 102, channels 106 and MISR 110 with values that are normally present at the beginning of a required start cycle and by running for the selected number of cycles.

In accordance with the features of the preferred embodiments, LBIST diagnostics apparatus 100 enables pausing at particular LBIST cycles and saving intermediate results in special dedicated registers. This may be best understood having reference to FIGS. 2 and 3, and the LBIST cycle flow of FIG. 5 with dual MISR results registers in accordance with the preferred embodiment, and the LBIST cycle flow of FIG. 6 with multiple MISR results registers in accordance with the preferred embodiment.

Figure 5:
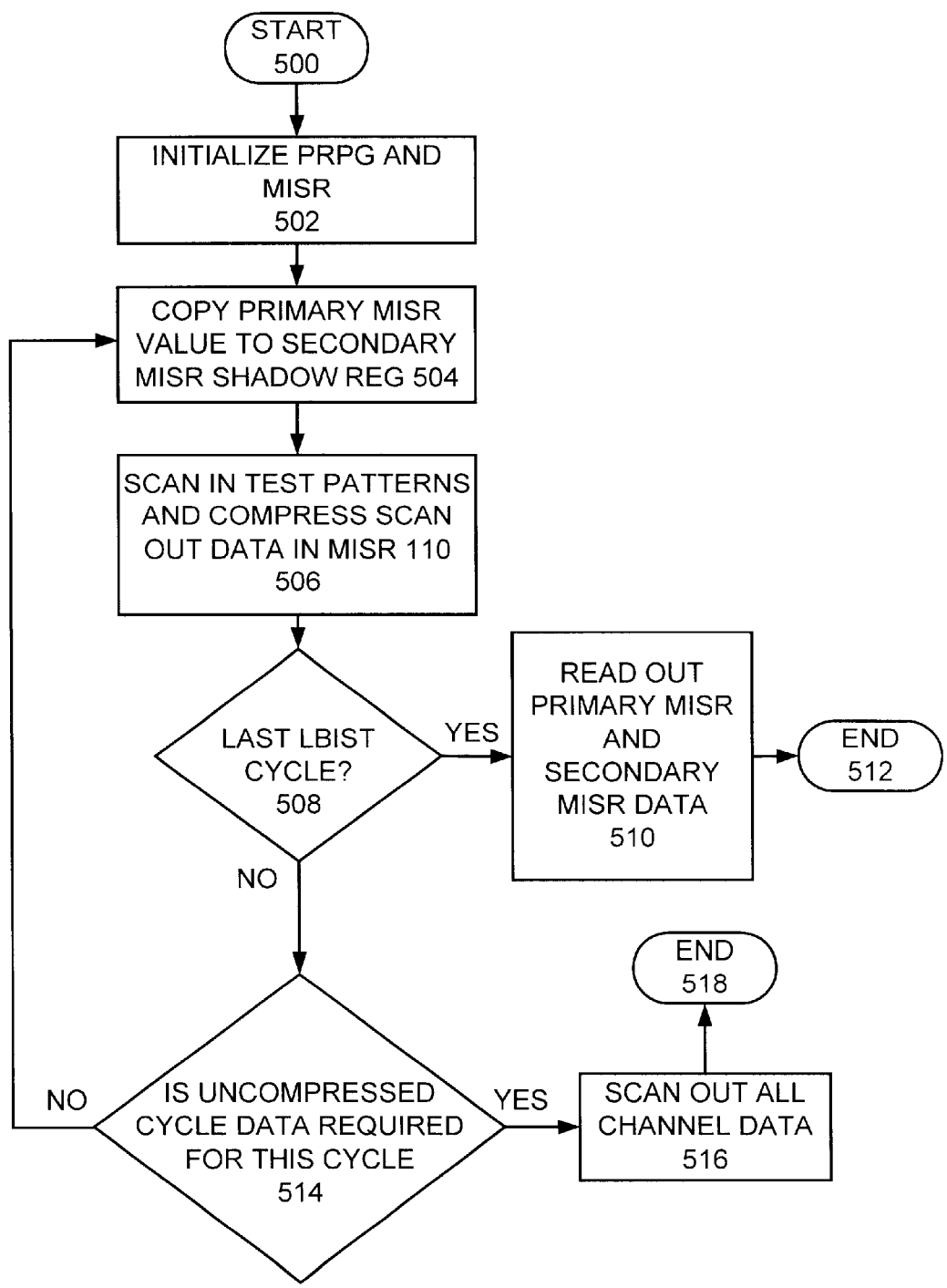
FIG. 5 is a flow chart illustrating a LBIST cycle flow with dual MISR results registers in accordance with the preferred embodiment.

Referring to FIG. 5, there are shown exemplary steps of an LBIST cycle flow with dual successive MISR results registers 110, 202 in accordance with the preferred embodiment starting at a block 500. The PRPG 102 and the MISR 110 are initialized as indicated in a block 502. The MISR value of the primary MISR 110 is copied into the secondary MISR shadow register 202 as indicated in a block 504. Test patterns are scanned into channels 106 from PRPG 102 and scan out data are compressed into the MISR 110 as indicated in a block 506. Checking for a last LBIST cycle is performed as indicated in a decision block 508. When the last LBIST cycle is identified, then the MISR data is read out of both the primary MISR 110 and the secondary MISR shadow register 202 as indicated in a block 510. Then the sequential operations end as indicated in a block 512. Checking whether uncompressed cycle data is required for this cycle is performed as indicated in a decision block 514. When uncompressed cycle data is not required for this cycle, then the sequence is repeated returning to block 504. The sequential steps are repeated many times to expose the channels 106 or logic under test to a large amount of test pattern data. When uncompressed cycle data is required for this cycle, then all channel data is scanned out as indicated in a block 516. Then the sequential operations end as indicated in a block 518.

Figure 6:
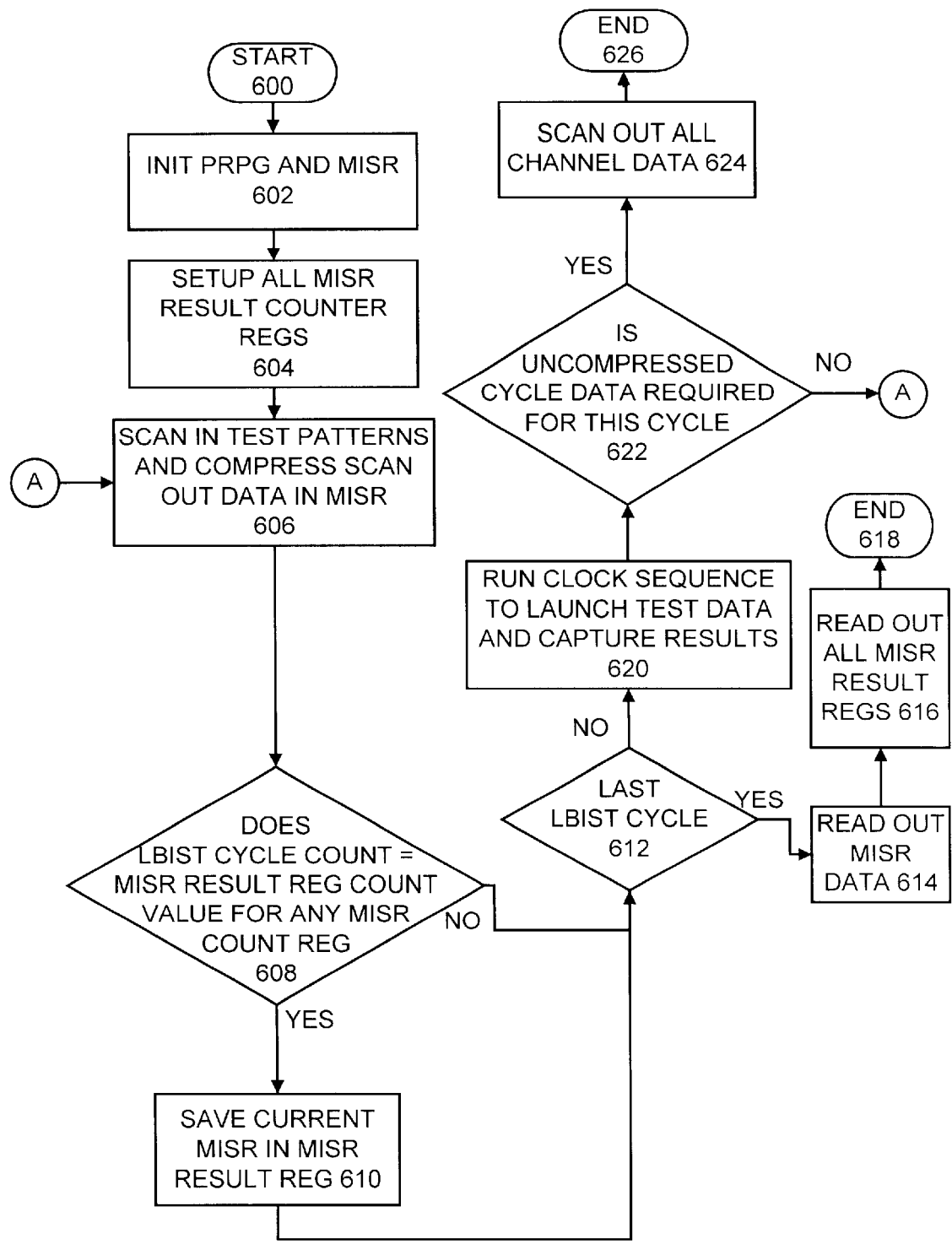
FIG. 6 is a flow chart illustrating a LBIST cycle flow with multiple MISR results registers in accordance with the preferred embodiment.

Referring to FIG. 6, there are shown exemplary steps of an LBIST cycle flow with multiple secondary MISR shadow registers in accordance with the preferred embodiment starting at a block 600. The PRPG 102 and the MISR 110 are initialized as indicated in a block 602. All the MISR result counter registers are set up as indicated in a block 604. Test patterns are scanned into channels 106 from PRPG 102 and scan out data are compressed into the MISR 110 as indicated in a block 606. Next checking whether the LBIST cycle count equals the MISR result register count value for any MISR count register is performed as indicated in a decision block 608. When the LBIST cycle count equals the current MISR result register count value for any MISR count register, then the current MISR data is saved in the current MISR result register as indicated in a block 610. After the current MISR data is saved at block 610 or when the LBIST cycle count is not equal to the current MISR result register count value for any MISR count register, then checking for a last LBIST cycle is performed as indicated in a decision block 612. When the last LBIST cycle is identified, then the MISR data is read out of the primary MISR 110 as indicated in a block 614. All MISR results registers are read out as indicated in a block 616. Then the sequential operations end as indicated in a block 618. When the last LBIST cycle is not identified, then a functional mode is set and a functional clock sequence is run to launch the scanned in test data through the combinational logic and to capture the results in the memory elements of channels 106 as indicated in a block 620. Checking whether uncompressed cycle data is required for this cycle is performed as indicated in a decision block 622. When uncompressed cycle data is not required for this cycle, then the sequence is repeated returning to block 606. The sequential steps are repeated many times to expose the channels 106 or logic under test to a large amount of test pattern data. When uncompressed cycle data is required for this cycle, then all channel data is scanned out as indicated in a block 624. Then the sequential operations end as indicated in a block 626.

Figure 7:
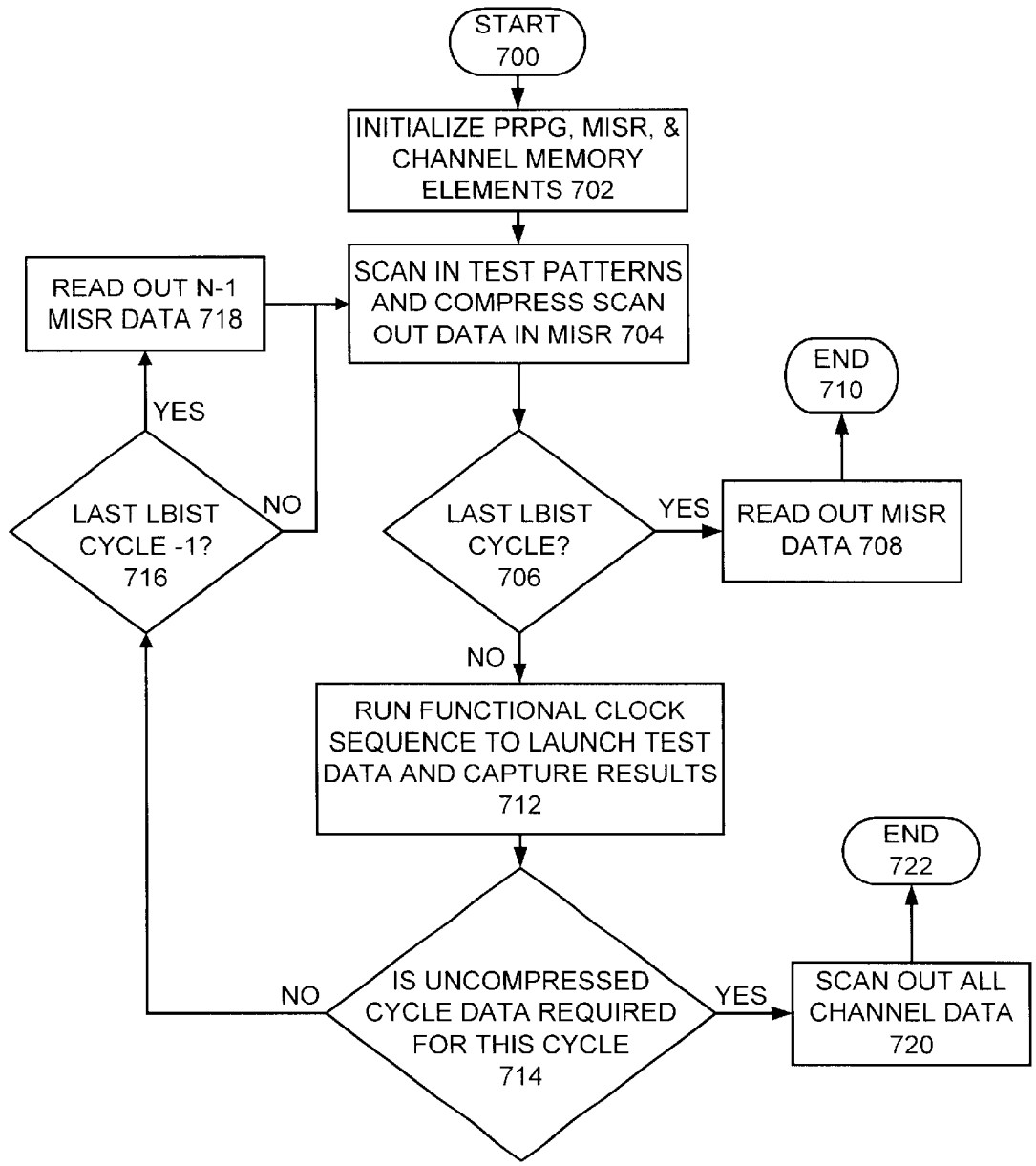
FIG. 7 is a flow chart illustrating LBIST operation with final two cycle MISR data saved in accordance with the preferred embodiment.

In accordance with the features of the preferred embodiments, LBIST diagnostics apparatus 100 enables pausing at various LBIST cycles and MISR values can be read out. FIG. 7 illustrates this operation where the last two cycles in the specified LBIST sequence are read out.

Referring to FIG. 7, there are shown exemplary steps of an LBIST operation with final two cycle MISR data saved in accordance with the preferred embodiment starting at a block 700. The PRPG 102, the MISR 110, and the memory elements of channel 106 are initialized as indicated in a block 702. Test patterns are scanned into channels 106 from PRPG 102 and scan out data are compressed into the MISR 110 as indicated in a block 704. Checking for a last LBIST cycle is performed as indicated in a decision block 706. When the last LBIST cycle is identified, then the MISR data is read out as indicated in a block 708. Then the sequential operations end as indicated in a block 710. When the last LBIST cycle is not identified, then a functional mode is set and a functional clock sequence is run to launch the scanned in test data through combinational logic and to capture the results in the memory elements of channels 106 as indicated in a block 712. Checking whether uncompressed cycle data is required for this cycle is performed as indicated in a decision block 714. When uncompressed cycle data is not required for this cycle, then checking whether this is the last LBIST cycle −1 is performed as indicated in a decision block 716. When the last LBIST cycle −1 is identified, then the MISR data is read out as indicated in a block 718. Optionally, decision block 716 can be constructed to trigger reading MISR data on any set of LBIST cycles, including all cycles, if desired. When the last LBIST cycle −1 is not identified or after the MISR data is read out at block 718, then the sequence is repeated returning to block 704. When determined that uncompressed cycle data is required for this cycle at decision block 714, then all channel data is scanned out as indicated in a block 720. Then the sequential operations end as indicated in a block 722.

In accordance with the features of the preferred embodiments, LBIST diagnostics apparatus 100 enables pausing at particular LBIST cycles and comparing intermediate results with values stored in special dedicated registers. This may be best understood having reference to FIG. 3, and the LBIST operation of a first algorithm illustrated in FIG. 8 for testing for failed LBIST cycle with multiple MISRs and hardware compare in accordance with the preferred embodiment, and the LBIST operation illustrated in FIG. 9 for finding a failed LBIST cycle with the first algorithm of FIG. 8 in accordance with the preferred embodiment.

Figure 8:
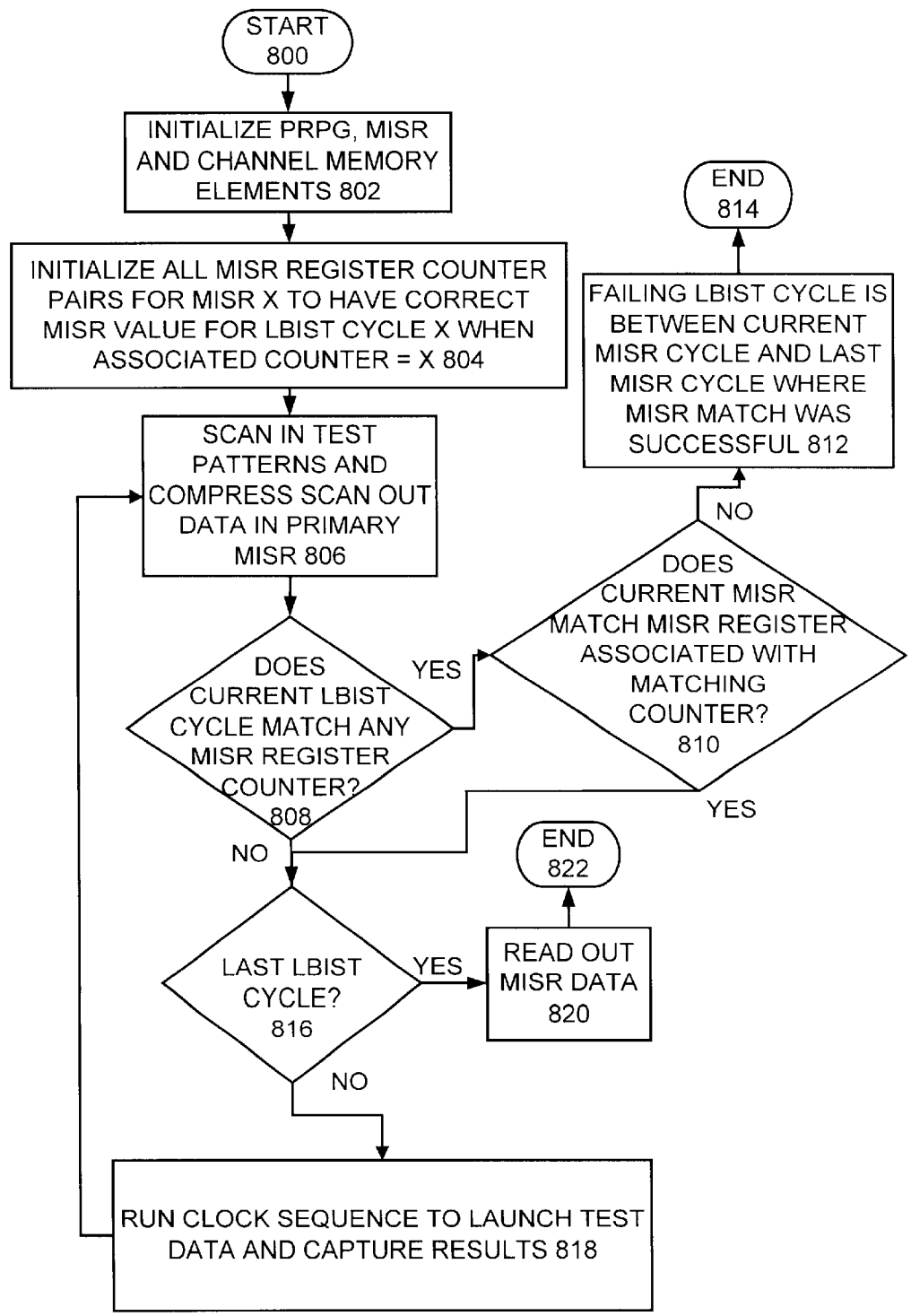
FIG. 8 is a flow chart illustrating LBIST operation of a first algorithm for testing for failed LBIST cycle with multiple MISRs and hardware compare in accordance with the preferred embodiment.

Referring to FIG. 8, there are shown exemplary steps of an LBIST operation of a first algorithm for testing for failed LBIST cycle with multiple secondary MISR shadow registers and hardware compare in accordance with the preferred embodiment starting at a block 800. The PRPG 102, the MISR 110, and the memory elements of channel 106 are initialized as indicated in a block 802. All MISR register counter pairs are initialized so that MISR X has the correct MISR value for LBIST cycle X when associated counter equals X as indicated in a block 804. Test patterns are scanned into channels 106 from PRPG 102 and scan out data are compressed into the MISR 110 as indicated in a block 806. Checking whether the current LBIST cycle matches any MISR register counter is performed as indicated in a decision block 808. When the current LBIST cycle matches a MISR register counter, checking whether the current MISR matches a MISR register associated with the matching MISR register counter is performed as indicated in a decision block 810. When the current MISR does not match a MISR register associated with the matching MISR register counter, then a failing LBIST cycle is identified between the current MISR cycle and the last MISR cycle where the MISR match was successful as indicated in a block 812. Then the sequential operations end as indicated in a block 814. When the current LBIST cycle does not match a MISR register counter, checking for a last LBIST cycle is performed as indicated in a decision block 816. When the last LBIST cycle is not identified, then a functional mode is set and a functional clock sequence is run to launch the scanned in test data through combinational logic and to capture the results in the memory elements of channels 106 as indicated in a block 818. Then the sequence is repeated returning to block 806. When the last LBIST cycle is identified, then the MISR data is read out as indicated in a block 820. Then the sequential operations end as indicated in a block 822.

Figure 9:
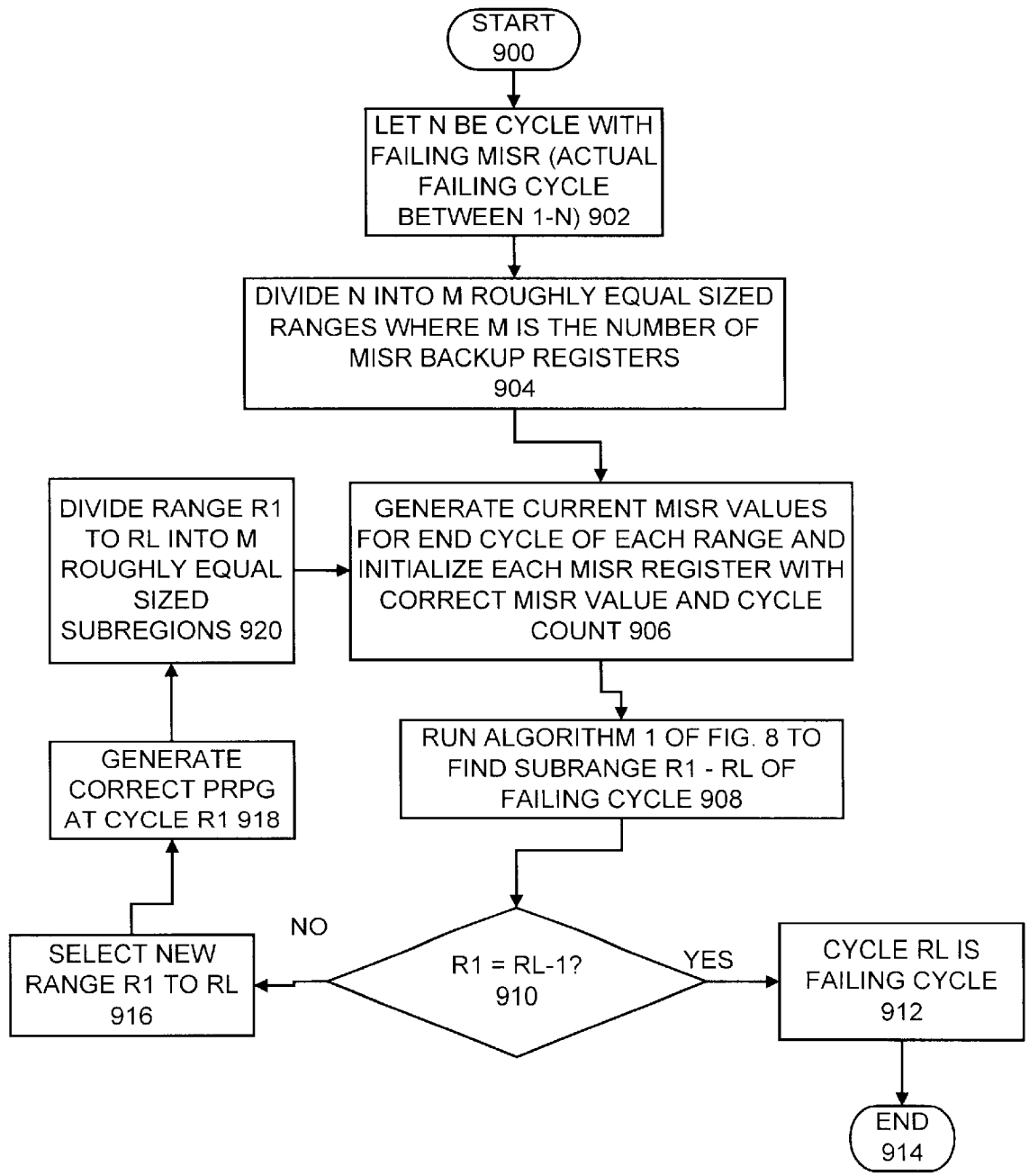
FIG. 9 is a flow chart illustrating LBIST operation for finding a failed LBIST cycle with the first algorithm of FIG. 8 in accordance with the preferred embodiment.

Referring to FIG. 9, there are shown exemplary steps of an LBIST operation for finding a failed LBIST cycle with the first algorithm of FIG. 8 in accordance with the preferred embodiment starting at a block 900. Initially a failing MISR cycle is set to N, while the actual failing cycle is between 1 through N as indicated in a block 902. In block 804, cycle N is divided into a predefined number M of roughly equal sized ranges, where M is the number of MISR backup registers 302. Current MISR values for the end cycle of each range are generated and each MISR 302 and count register 304 are initialized with the correct MISR value and cycle count as indicated in a block 906. Then the algorithm 1 of FIG. 8 is run to find a subrange R1-RL of the failing cycle as indicated in a block 908. Check whether R1 equals RI−1 is performed as indicated in a decision block 910. When R1 equals RI−1, then RL is the failing cycle as indicated in a block 912. Then the sequential operations end as indicated in a block 914. Otherwise, when R1 does not equal RI−1, then a new range R1 to RL is selected as indicated in a block 916. A correct PRPG is generated at the selected cycle range R1 as indicated in a block 918. Then the selected cycle range R1 is divided into the predefined number M of roughly equal sized ranges, where M is the number of MISR backup registers 302 as indicated in a block 920. Then the sequential steps are repeated returning to block 906 until the failing cycle is identified.

In accordance with the features of the preferred embodiments, LBIST diagnostics apparatus 100 enables repeatedly running a particular LBIST test cycle or a particular sequence of LBIST test cycles as respectively illustrated and described with respect to FIGS. 10A and 10B and FIGS. 11A and 11B. These capabilities are particularly useful for diagnosis of intermittently failing LBIST cycles.

Figure 10A:
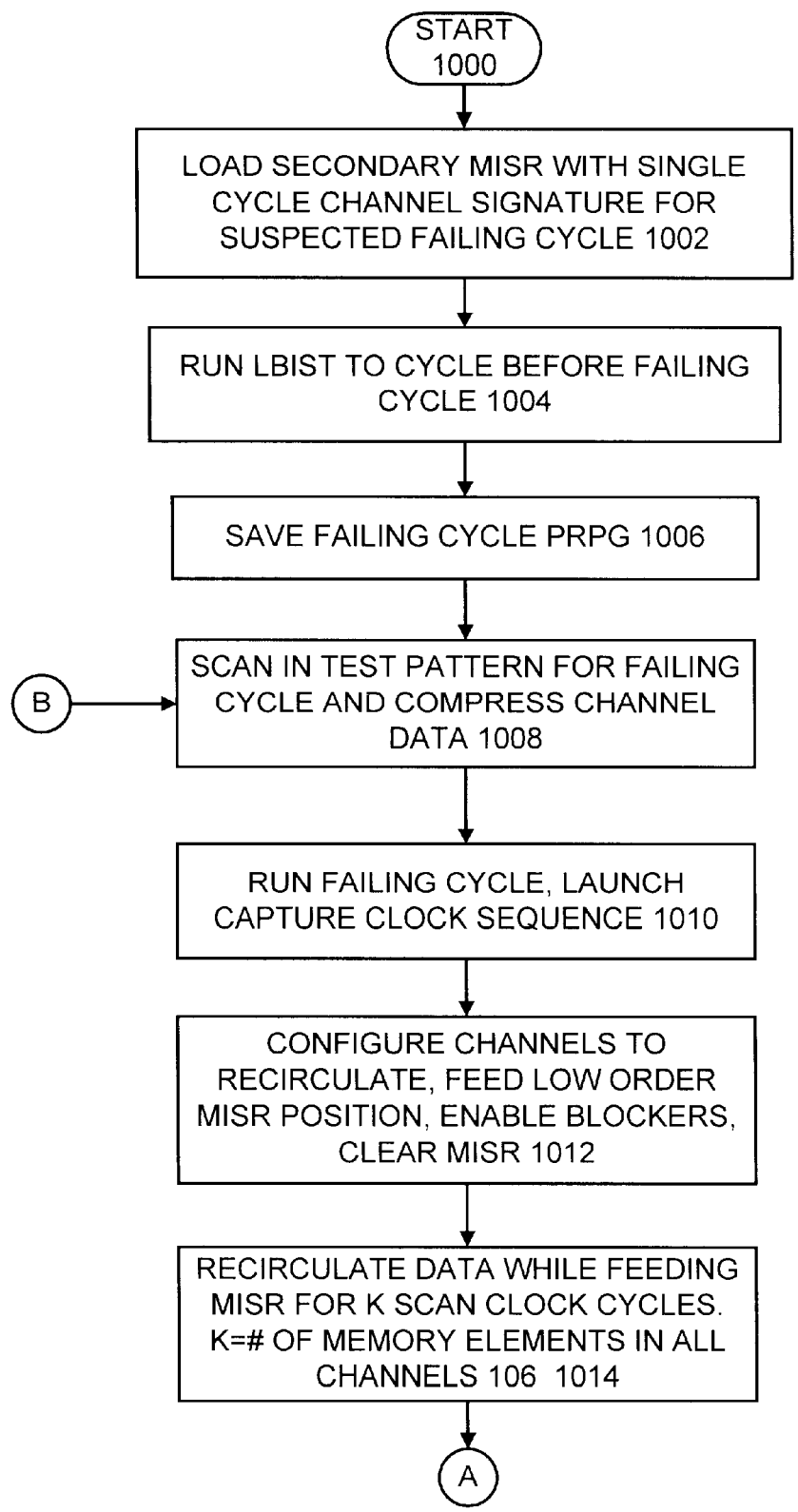
FIGS. 10A and 10B together provide a flow chart illustrating LBIST operation for repeating a suspected intermittently failing cycle with the apparatus of FIGS. 1A and 2.
Figure 10B:
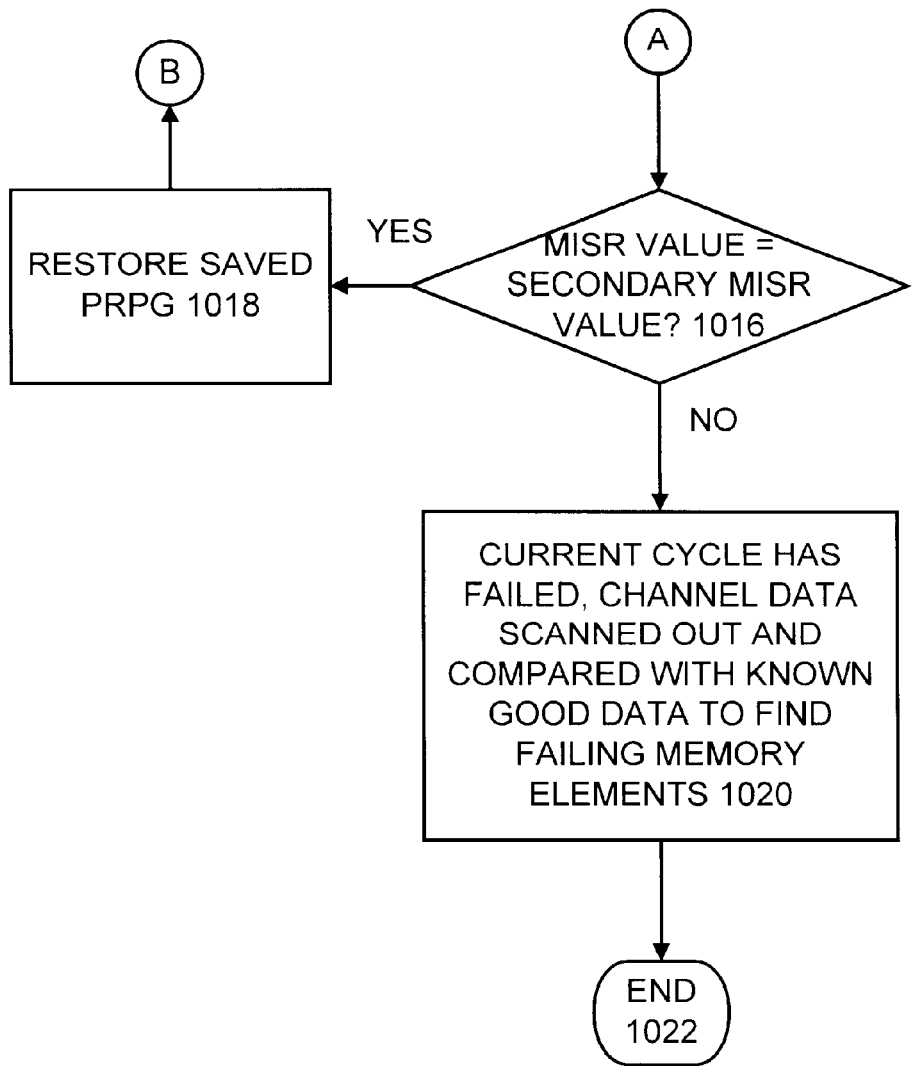

Referring to FIGS. 10A and 10B, there are shown exemplary steps of an LBIST operation for repeating a suspected intermittently failing cycle with the apparatus of FIGS. 1 and 2 with one secondary MISR 202 starting at a block 1000. The secondary MISR 202 is loaded with a single cycle channel signature for a suspected failing cycle as indicated in a block 1002. LBIST is run to the cycle before the suspected failing cycle as indicated in a block 1004. Then the failing cycle PRPG is saved as indicated in a block as indicated in a block 1006. Test pattern for the failing cycle is scanned in and the channel data are compressed as indicated in a block 1008. The failing cycle launching capture clock sequence is run as indicated in a block 1010. Channels 106 are configured to recirculate, to feed the low order MISR position, enable blockers 108, and clear MISR 110 as indicated in a block 1012. Then data is recirculated while feeding MISR 110 for K scan clock cycles, where K equals the number of memory element in all channels 106 as indicated in a block 1014.

Referring to FIG. 10B, checking whether the MISR value equals the secondary MISR value as indicated in a decision block 1016. When the MISR value equals the secondary MISR value, then the saved PRPG is restored as indicated in a block 1018. Then the sequential steps are repeated returning to block 1008. When the MISR value does not equal the secondary MISR value, then the current cycle has failed and the channel data can be scanned out and compared with known good data to find failing memory elements as indicated in a block 1020. Then the sequential operations end as indicated in a block 1022.

Figure 11A:
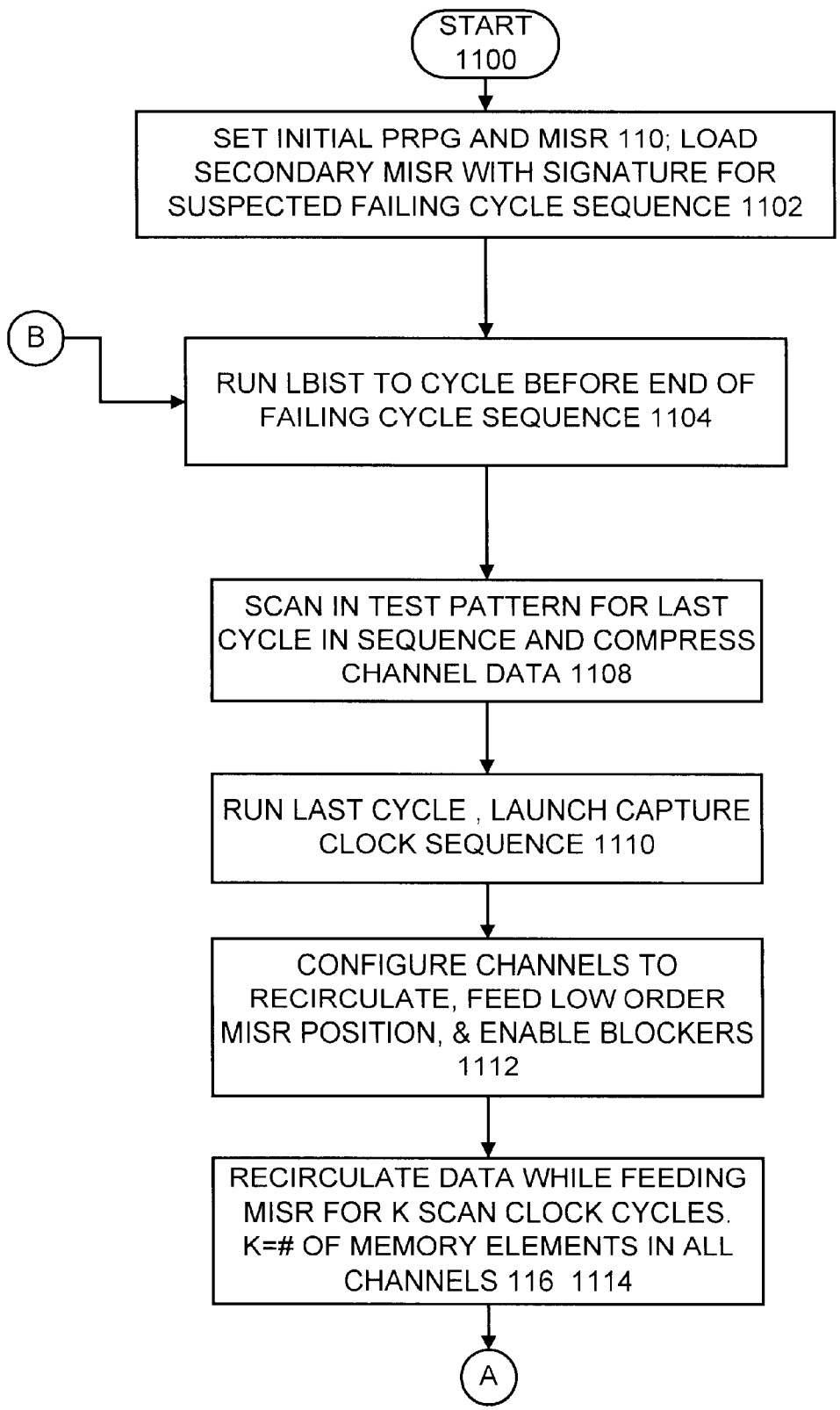
FIGS. 11A and 11B together provide a flow chart illustrating LBIST operation for repeating a suspected intermittently failing cycle sequence with the apparatus of FIGS. 1A and 2.
Figure 11B:
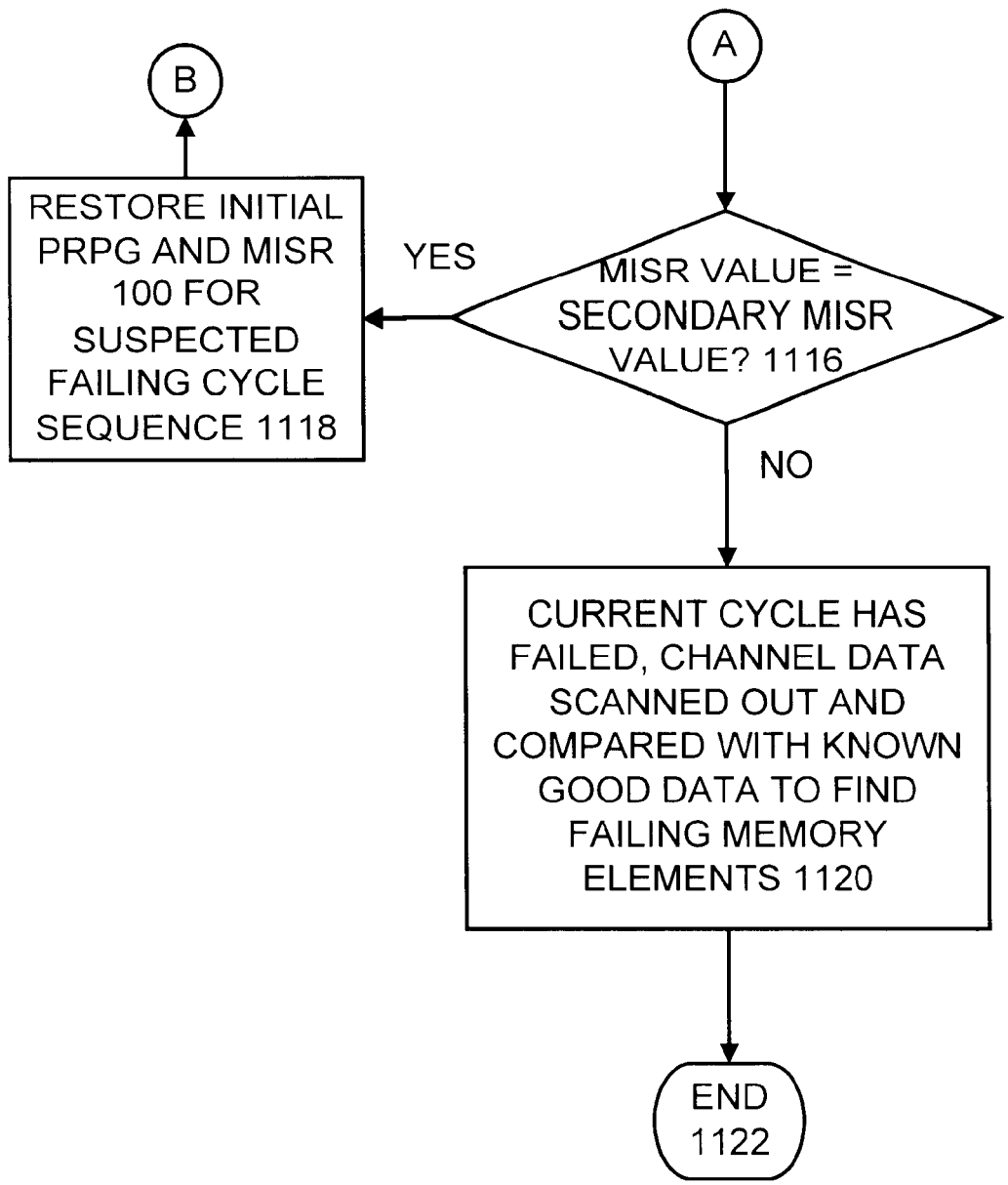

Referring to FIGS. 11A and 11B, there are shown exemplary steps of an LBIST operation for repeating a suspected intermittently failing cycle sequence with the apparatus of FIGS. 1A and 2 with one secondary MISR 202 starting at a block 1100. The initial PRPG and MISR 110 are set and the secondary MISR 202 is loaded with a signature for a suspected failing cycle sequence as indicated in a block 1102. LBIST is run to the last cycle before the end of the suspected failing cycle sequence as indicated in a block 1104. Then the test pattern for the last cycle is scanned in and the channel data are compressed as indicated in a block 1108. The last cycle launching capture clock sequence is run as indicated in a block 1110. Channels 106 are configured to recirculate, to feed the low order MISR position, and enable blockers 118 as indicated in a block 1112. Then data is recirculated while feeding MISR 110 for K scan clock cycles, where K equals the number of memory element in all channels 106 as indicated in a block 1114.

Referring to FIG. 11B, checking whether the MISR value equals the secondary MISR value as indicated in a decision block 1116. When the MISR value equals the secondary MISR value, then the initial PRPG and MISR 110 are restored for the suspected failing cycle sequence as indicated in a block 1118. Then the sequential steps are repeated returning to block 1104. When the MISR value does not equal the secondary MISR value, then the current cycle has failed and the channel data can be scanned out and compared with known good data to find failing memory elements as indicated in a block 1120. Then the sequential operations end as indicated in a block 1122.

Figure 12:
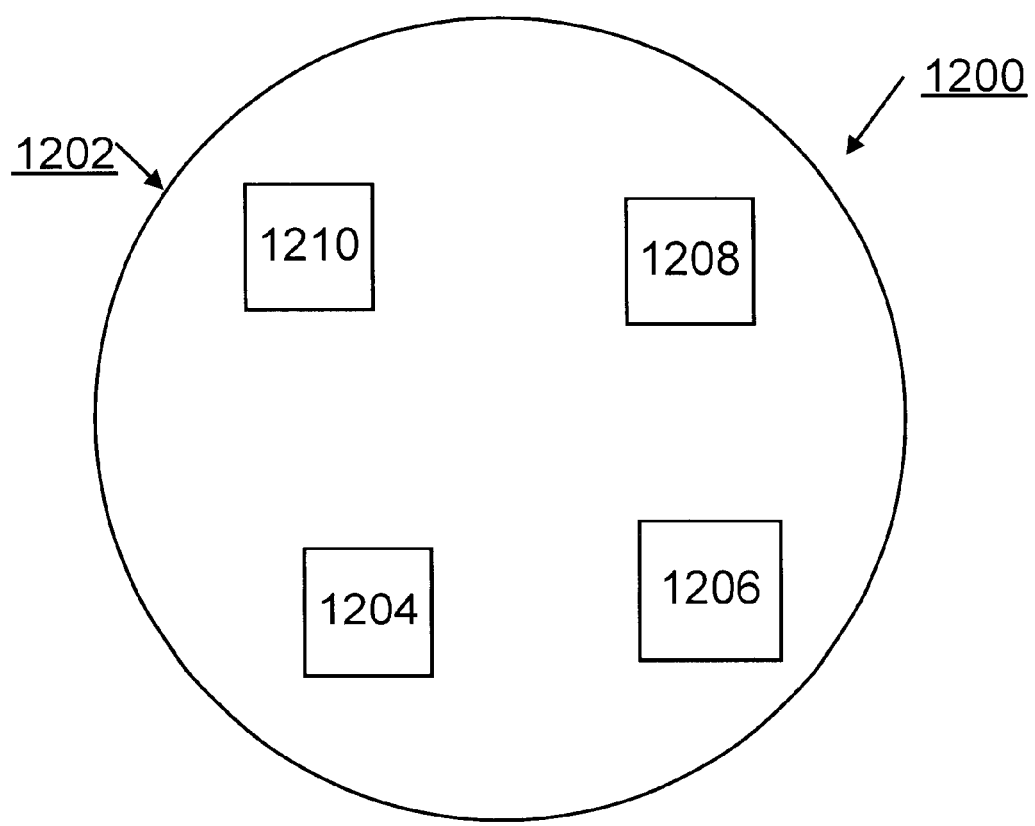
FIG. 12 is a block diagram illustrating a computer program product in accordance with the preferred embodiment.

Referring now to FIG. 12, an article of manufacture or a computer program product 1200 of the invention is illustrated. The computer program product 1200 includes a recording medium 1202, such as, a floppy disk, a high capacity read only memory in the form of an optically read compact disk or CD-ROM, a tape, a transmission type media such as a digital or analog communications link, or a similar computer program product. Recording medium 1202 stores program means 1204, 1206, 1208, 1210 on the medium 1202 for carrying out the methods for enhanced Logic Built in Self Test (LBIST) diagnostics of intermittent failures of the preferred embodiment in the system 100 of FIG. 1.

A sequence of program instructions or a logical assembly of one or more interrelated modules defined by the recorded program means 1204, 1206, 1208, 1210, direct the system 100 for enhanced Logic Built in Self Test (LBIST) diagnostics of intermittent failures of the preferred embodiment.

While the present invention has been described with reference to the details of the embodiments of the invention shown in the drawing, these details are not intended to limit the scope of the invention as claimed in the appended claims.

What is claimed is:

1. Apparatus for implementing enhanced Logic Built in Self Test (LBIST) diagnostics of intermittent failures comprising:

a plurality of sequential channels under test;

a plurality of first multiplexers; a respective one of said plurality of first multiplexers coupled between adjacent sequential channels; each of said first multiplexers selectively receiving a first data input in a first scan mode with said sequential channels configured in a common scan path and a second data input in a second scan mode with each said sequential channels configured in a separate scan path responsive to a first control signal;

a second multiplexer, coupled between a test data output of a last sequential channel and said first data input of a first sequential channel; said second multiplexer selectively receiving said test data output of said last sequential channel and an external test data input responsive to a recirculate control signal;

a first multiple input signature register (MISR), said first multiple input signature register including multiple MISR inputs coupled to a respective one of said plurality of sequential channels under test;

a blocker function coupled between said first multiple input signature register and said plurality of sequential channels under test; said blocker function configured for blocking all MISR inputs except for a single MISR input receiving said test data output of said last sequential channel responsive to said recirculate control signal; and a second MISR shadow register coupled to said first multiple input signature register.

2. Apparatus for implementing enhanced Logic Built in Self Test (LBIST) diagnostics of intermittent failures as recited in claim 1 further includes a pseudo random pattern generator (PRPG) coupled to said second data input of said first multiplexers in said second scan mode with each said sequential channels configured in a separate scan path.

3. Apparatus for implementing enhanced Logic Built in Self Test (LBIST) diagnostics of intermittent failures as recited in claim 2 wherein said blocker function coupled between said first multiple input signature register and said plurality of sequential channels under test couples all MISR inputs to said first multiple input signature register in said second scan mode with each said sequential channels configured in a separate scan path.

4. Apparatus for implementing enhanced Logic Built in Self Test (LBIST) diagnostics of intermittent failures as recited in claim 1 wherein said first multiple input signature register stores compressed scan out data from said plurality of sequential channels under test in said second scan mode with each said sequential channels configured in a separate scan path.

5. Apparatus for implementing enhanced Logic Built in Self Test (LBIST) diagnostics of intermittent failures as recited in claim 1 wherein said second MISR shadow register stores MISR data copied from said first multiple input signature register.

6. Apparatus for implementing enhanced Logic Built in Self Test (LBIST) diagnostics of intermittent failures as recited in claim 1 wherein said first multiple input signature register stores compressed test data output from said last sequential channel of said plurality of sequential channels under test in said first scan mode with each said sequential channels configured in said common scan path responsive to said recirculated control signal.

7. Apparatus for implementing enhanced Logic Built in Self Test (LBIST) diagnostics of intermittent failures as recited in claim 6 wherein said test data output from said last sequential channel of said plurality of sequential channels under test is recirculated through said plurality of sequential channels under test in said first scan mode with each said sequential channels configured in said common scan path responsive to said recirculated control signal.

8. Apparatus for implementing enhanced Logic Built in Self Test (LBIST) diagnostics of intermittent failures as recited in claim 1 includes a plurality of secondary MISR shadow registers.

9. Apparatus for implementing enhanced Logic Built in Self Test (LBIST) diagnostics of intermittent failures as recited in claim 8 includes an associated cycle count register with each said plurality of secondary MISR shadow registers; said plurality of secondary MISR shadow registers with said associated cycle count register used for storing MISR data for comparison with MISR data from the first multiple input signature register with a matching cycle count.

10. Apparatus for implementing enhanced Logic Built in Self Test (LBIST) diagnostics of intermittent failures as recited in claim 1 includes an LBIST controller.

11. Apparatus for implementing enhanced Logic Built in Self Test (LBIST) diagnostics of intermittent failures as recited in claim 10 wherein said LBIST controller includes an LBIST control state machine and an LBIST cycle counter.

12. Apparatus for implementing enhanced Logic Built in Self Test (LBIST) diagnostics of intermittent failures as recited in claim 10 wherein said LBIST controller provides said first control signal and said recirculated control signal.

13. Apparatus for implementing enhanced Logic Built in Self Test (LBIST) diagnostics of intermittent failures as recited in claim 10 wherein said LBIST controller provides a load control signal to said second MISR shadow register for storing MISR data copied from said first multiple input signature register.

14. Apparatus for implementing enhanced Logic Built in Self Test (LBIST) diagnostics of intermittent failures as recited in claim 10 includes a plurality of secondary MISR shadow registers wherein said LBIST controller provides a load/compare control signal to said plurality of secondary MISR shadow registers and said plurality of secondary MISR shadow registers provide a compare pass/fail signal to said LBIST controller.

15. Apparatus for implementing enhanced Logic Built in Self Test (LBIST) diagnostics of intermittent failures as recited in claim 1 wherein each of said plurality of sequential channels under test has an identical length and wherein each of said plurality of first multiplexers selectively receiving a third data input in a third channel recirculate scan mode responsive to a second control signal applied to said plurality of first multiplexers.

16. Apparatus for implementing enhanced Logic Built in Self Test (LBIST) diagnostics of intermittent failures as recited in claim 15 wherein an output of each of said plurality of sequential channels under test is multiplexed back to a respective input of each of said plurality of sequential channels under test in said third channel recirculate scan mode.

17. A method for implementing enhanced Logic Built in Self Test (LBIST) diagnostics of intermittent failures in a plurality of sequential channels under test, said method comprising the steps of:
provided a plurality of first multiplexers; a respective one of said plurality of first multiplexers coupled between adjacent sequential channels;
applying a first control signal to said first multiplexers for selectively configuring said sequential channels in a common scan path to receive a first data input in a first scan mode and each said sequential channels in a separate scan path to receive a second data input in a second scan mode;
providing a second multiplexer, coupled between a test data output of a last sequential channel and said first data input of a first sequential channel;
applying a recirculated control signal to said second multiplexer for selectively applying one of said test data output of said last sequential channel to said first data input of a first sequential channel and an external test data input;
providing a first multiple input signature register (MISR) having multiple MISR inputs coupled to a respective one of said plurality of sequential channels under test;
providing a blocker function coupled between said first multiple input signature register and said plurality of sequential channels under test; applying said recirculated control signal to said blocker function for blocking all MISR inputs except for a single MISR input receiving said test data output of said last sequential channel; and
providing a second MISR shadow register coupled to said first multiple input signature register.

18. The method for implementing enhanced Logic Built in Self Test (LBIST) diagnostics of intermittent failures in a plurality of sequential channels under test as recited in claim 17 wherein each of said sequential channels is configured in said separate scan path by said first multiplexers to receive pseudo random pattern data in said second scan mode.

19. The method for implementing enhanced Logic Built in Self Test (LBIST) diagnostics of intermittent failures in a plurality of sequential channels under test as recited in claim 17 wherein said sequential channels are configured in a common scan path by said first multiplexers to receive a recirculated test output data in said first scan mode.

20. The method for implementing enhanced Logic Built in Self Test (LBIST) diagnostics of intermittent failures in a plurality of sequential channels under test as recited in claim 19 wherein said first multiple input signature register receives said single MISR input of said test data output from said last sequential channel with said sequential channels receiving said recirculated test output data in said first scan mode.

21. The method for implementing enhanced Logic Built in Self Test (LBIST) diagnostics of intermittent failures in a plurality of sequential channels under test as recited in claim 19 wherein said first multiple input signature register receives multiple MISR inputs from each respective one of said plurality of sequential channels under test in said second scan mode.

22. The method for implementing enhanced Logic Built in Self Test (LBIST) diagnostics of intermittent failures in a plurality of sequential channels under test as recited in claim 19 wherein said second MISR shadow register stores MISR data for comparison with MISR data from said first multiple input signature register.

23. The method for implementing enhanced Logic Built in Self Test (LBIST) diagnostics of intermittent failures in a plurality of sequential channels under test as recited in claim 19 wherein said second MISR shadow register includes a plurality of secondary MISR shadow registers with an associated cycle count register; each of said plurality of secondary MISR shadow registers stores MISR data for comparison with MISR data from said first multiple input signature register.

24. The method for implementing enhanced Logic Built in Self Test (LBIST) diagnostics of intermittent failures in a plurality of sequential channels under test as recited in claim 23 wherein each of said plurality of secondary MISR shadow registers stores MISR data for comparison with MISR data from said first multiple input signature register with a matching cycle count.

25. The method for implementing enhanced Logic Built in Self Test (LBIST) diagnostics of intermittent failures in a plurality of sequential channels under test as recited in claim 17 wherein each of said plurality of sequential channels under test has an identical length and further includes the step of applying a second control signal to said first multiplexers for selectively configuring said sequential channels in a channel recirculate third scan mode.

26. The method for implementing enhanced Logic Built in Self Test (LBIST) diagnostics of intermittent failures in a plurality of sequential channels under test as recited in claim 25 wherein each of said sequential channels is configured with a respective channel output applied to a respective channel input by said first multiplexers in said channel recirculate third scan mode.

27. The method for implementing enhanced Logic Built in Self Test (LBIST) diagnostics of intermittent failures in a plurality of sequential channels under test as recited in claim 17 wherein said second MISR shadow register includes a plurality of secondary MISR shadow registers with an associated cycle count register and further includes the steps of comparing a current LBIST cycle with each said associated cycle count register of said plurality of secondary MISR shadow registers; and responsive to identifying a match of said current LBIST cycle and one said associated cycle count register, comparing a current MISR value of said first multiple input signature register with a MISR value of said secondary MISR shadow register associated with said one said associated cycle count register to identify a failed LBIST cycle.

28. The method for implementing enhanced Logic Built in Self Test (LBIST) diagnostics of intermittent failures in a plurality of sequential channels under test as recited in claim 17 wherein said second MISR shadow register includes a plurality of secondary MISR shadow registers with an associated cycle count register and further includes the steps of testing for a failed LBIST cycle utilizing a hardware compare with each of said plurality of secondary MISR shadow registers and said MISR value of said first multiple input signature register.

29. The method for implementing enhanced Logic Built in Self Test (LBIST) diagnostics of intermittent failures in a plurality of sequential channels under test as recited in claim 17 further includes the steps of copying a MISR value to said second MISR shadow register; scanning test patterns into said plurality of sequential channels under test and compressing scan out data into said first multiple input signature register; and comparing said MISR value of said first multiple input signature register with said MISR value of said second MISR shadow register to identify a failed LBIST cycle.

30. The method for implementing enhanced Logic Built in Self Test (LBIST) diagnostics of intermittent failures in a plurality of sequential channels under test as recited in claim 17 wherein said second MISR shadow register includes a plurality of secondary MISR shadow registers with an associated cycle count register and further includes the steps of initializing a MISR value for each of said plurality of secondary MISR shadow registers with an associated cycle count in said associated cycle count register; scanning test patterns into said plurality of sequential channels under test and compressing scan out data into said first multiple input signature register; and comparing said MISR value of said first multiple input signature register with said MISR value of each of said secondary MISR shadow registers to identify a failed LBIST cycle.

31. The method for implementing enhanced Logic Built in Self Test (LBIST) diagnostics of intermittent failures in a plurality of sequential channels under test as recited in claim 17 further includes the steps of identifying a suspected failing LBIST cycle; initializing a MISR value in said second MISR shadow register for said suspected failing LBIST cycle; scanning test patterns into said plurality of sequential channels under test and compressing scan out data into said first multiple input signature register; and comparing said MISR value of said first multiple input signature register with said MISR value of said second MISR shadow register to identify a failed LBIST cycle.

32. The method for implementing enhanced Logic Built in Self Test (LBIST) diagnostics of intermittent failures in a plurality of sequential channels under test as recited in claim 17 further includes the steps of identifying a suspected failing LBIST cycle sequence; initializing a MISR value in said second MISR shadow register for said suspected failing LBIST cycle sequence; scanning test patterns into said plurality of sequential channels under test and compressing scan out data into said first multiple input signature register; and comparing said MISR value of said first multiple input signature register with said MISR value of said second MISR shadow register to identify a failed LBIST cycle.

* * * * *